US010804165B2

(12) United States Patent
Seo et al.

(10) Patent No.: US 10,804,165 B2
(45) Date of Patent: Oct. 13, 2020

(54) SOURCE AND DRAIN ISOLATION FOR CMOS NANOSHEET WITH ONE BLOCK MASK

(71) Applicant: International Business Machines Corporation, Armonk, NY (US)

(72) Inventors: Soon-Cheon Seo, Glenmont, NY (US); Choonghyun Lee, Rensselaer, NY (US); Injo Ok, Loudonville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/440,095

(22) Filed: Jun. 13, 2019

(65) Prior Publication Data

US 2019/0295899 A1 Sep. 26, 2019

Related U.S. Application Data

(62) Division of application No. 15/866,851, filed on Jan. 10, 2018, now Pat. No. 10,325,820.

(51) Int. Cl.
*H01L 21/70* (2006.01)
*H01L 21/8238* (2006.01)
(Continued)

(52) U.S. Cl.
CPC ........... *H01L 21/823878* (2013.01); *H01L 21/823814* (2013.01); *H01L 21/823821* (2013.01);
(Continued)

(58) Field of Classification Search
CPC ......... H01L 21/823878; H01L 27/0924; H01L 29/165; H01L 29/66553; H01L 29/0669;
(Continued)

(56) References Cited

U.S. PATENT DOCUMENTS 7,601,570 B2 10/2009 Damlencourt
9,123,790 B2 9/2015 Pillarisetty et al.
(Continued)

OTHER PUBLICATIONS

List of IBM Patents or Applications Treated as Related (2 pages).

*Primary Examiner* — Ismail A Muse
(74) *Attorney, Agent, or Firm* — Douglas Pearson; Michael J. Chang, LLC

(57) ABSTRACT

Techniques for source/drain isolation in nanosheet devices are provided. In one aspect, a method of forming a nanosheet device includes: forming an alternating series of sacrificial/active channel nanosheets as a stack on a substrate; forming gates on the stack; forming spacers alongside opposite sidewalls of the gates; patterning the stack, in between the spacers, into individual PFET/NFET stacks and pockets in the substrate; laterally recessing the sacrificial nanosheets in the PFET/NFET stacks to expose tips of the active channel nanosheets in the PFET/NFET stacks; forming inner spacers alongside the PFET/NFET stacks covering the tips of the active channel nanosheets; forming a protective layer lining the pockets; and selectively etching back the inner spacers to expose tips of the active channel nanosheets and epitaxially growing source and drains from the exposed tips of the active channel nanosheets sequentially in the PFET/NFET stacks. A nanosheet device is also provided.

19 Claims, 12 Drawing Sheets

(51) Int. Cl.
  *H01L 29/06* (2006.01)
  *H01L 29/66* (2006.01)
  *H01L 29/165* (2006.01)
  *H01L 27/092* (2006.01)
  *H01L 29/786* (2006.01)
  *H01L 29/423* (2006.01)
  *H01L 29/775* (2006.01)
  *H01L 29/49* (2006.01)
  *H01L 29/51* (2006.01)
  *H01L 29/78* (2006.01)

(52) U.S. Cl.
  CPC ........ *H01L 27/092* (2013.01); *H01L 27/0924* (2013.01); *H01L 29/0653* (2013.01); *H01L 29/0669* (2013.01); *H01L 29/165* (2013.01); *H01L 29/42392* (2013.01); *H01L 29/66439* (2013.01); *H01L 29/66545* (2013.01); *H01L 29/66553* (2013.01); *H01L 29/66772* (2013.01); *H01L 29/775* (2013.01); *H01L 29/78696* (2013.01); *H01L 21/823807* (2013.01); *H01L 29/4966* (2013.01); *H01L 29/517* (2013.01); *H01L 29/7848* (2013.01)

(58) Field of Classification Search
  CPC ..... H01L 21/823814; H01L 21/823821; H01L 29/66545
  See application file for complete search history.

(56) References Cited

U.S. PATENT DOCUMENTS

| | | |
|---|---|---|
| 9,324,812 B2 | 4/2016 | Yang et al. |
| 9,608,059 B2 | 3/2017 | Cappellani et al. |
| 9,620,590 B1 | 4/2017 | Bergendahl et al. |
| 9,755,017 B1 | 9/2017 | Guillorn et al. |
| 2008/0135949 A1 | 6/2008 | Lo et al. |
| 2016/0027929 A1 | 1/2016 | Cheng et al. |
| 2016/0276432 A1* | 9/2016 | Chang ............... H01L 29/66742 |
| 2016/0372546 A1 | 12/2016 | Leobandung |
| 2017/0005190 A1 | 1/2017 | Chang et al. |
| 2017/0110554 A1* | 4/2017 | Tak .................... H01L 29/4991 |
| 2017/0133459 A1 | 5/2017 | Pranatharthiharan et al. |
| 2017/0256615 A1 | 9/2017 | Chen et al. |
| 2017/0271477 A1 | 9/2017 | Palle et al. |
| 2017/0271514 A1 | 9/2017 | Kittl et al. |
| 2017/0365604 A1* | 12/2017 | Suh .................... H01L 27/0924 |
| 2018/0151452 A1 | 5/2018 | Doornbos et al. |
| 2018/0175167 A1 | 6/2018 | Reboh et al. |
| 2018/0175214 A1 | 6/2018 | Chen et al. |
| 2018/0190829 A1 | 7/2018 | Song et al. |
| 2018/0308986 A1 | 10/2018 | Chao et al. |
| 2019/0043967 A1* | 2/2019 | Mulfinger ......... H01L 21/02236 |
| 2019/0074362 A1* | 3/2019 | Lee .................. H01L 29/66553 |

* cited by examiner $$Si + Ge + 2GeO_2 \rightarrow Ge + 2GeO + SiO_2$$

SOURCE AND DRAIN ISOLATION FOR CMOS NANOSHEET WITH ONE BLOCK MASK

CROSS-REFERENCE TO RELATED APPLICATIONS

This application is a divisional of U.S. application Ser. No. 15/866,851 filed on Jan. 10, 2018, now U.S. Pat. No. 10,325,820, the contents of which are incorporated by reference herein.

FIELD OF THE INVENTION

The present invention relates to complementary metal oxide semiconductor (CMOS) nanosheet devices, and more particularly, to techniques for source and drain isolation in CMOS nanosheet devices.

BACKGROUND OF THE INVENTION

Complementary metal oxide semiconductor (CMOS) nanosheet devices include a vertical stack of channel layers interconnecting a source and a drain. Advantageously, CMOS nanosheet devices can employ gate-all-around (GAA) designs since the channel layers are anchored at either end by the source and drain.

A drawback with current nanosheet device designs, however, is that the epitaxy growth process used to form the source and drains can cause parasitic growth on the underlying substrate. This parasitic growth can undesirably cause shorts between source and drain.

Thus, improved nanosheet device fabrication techniques would be desirable.

SUMMARY OF THE INVENTION

The present invention provides techniques for source and drain isolation in CMOS nanosheet devices. In one aspect of the invention, a method of forming a nanosheet device is provided. The method includes: forming an alternating series of sacrificial and active channel nanosheets as a stack on a substrate; forming gates on the stack; forming spacers alongside opposite sidewalls of the gates; patterning the stack, in between the spacers, into individual PFET and NFET stacks, wherein the patterning forms pockets in the substrate between the PFET and NFET stacks; laterally recessing the sacrificial nanosheets in the PFET and NFET stacks to expose tips of the active channel nanosheets in the PFET and NFET stacks; forming inner spacers alongside the PFET and NFET stacks covering the tips of the active channel nanosheets; forming an oxide protective layer lining the pockets in the substrate; and selectively etching back the inner spacers to expose tips of the active channel nanosheets and epitaxially growing source and drains from the exposed tips of the active channel nanosheets sequentially in the PFET and NFET stacks.

In another aspect of the invention, a nanosheet device is provided. The nanosheet device includes: individual PFET and NFET stacks on a substrate, wherein the PFET and NFET stacks each includes active channel nanosheets; pockets in the substrate between the PFET and NFET stacks; an oxide protective layer lining the pockets in the substrate; epitaxial source and drains on opposite sides of the PFET and NFET stacks; gates surrounding at least a portion of each of the active channel nanosheets in a gate-all-around configuration; and inner spacers offsetting the gates from the epitaxial source and drains.

A more complete understanding of the present invention, as well as further features and advantages of the present invention, will be obtained by reference to the following detailed description and drawings.

DETAILED DESCRIPTION OF PREFERRED EMBODIMENTS

As provided above, parasitic growth from the substrate during source and drain epitaxy in complementary metal-oxide semiconductor (CMOS) device fabrication can undesirably lead to source-to-drain shorts. Advantageously, provided herein are techniques for nanosheet device fabrication whereby a protective dielectric layer is employed lining the substrate in the source and drain. The protective dielectric layer prevents epitaxial growth from the substrate.

A first exemplary embodiment is described by way of reference to FIGS. 1-19. In the examples that follow, at least one n-channel field-effect transistor (NFET) and at least one p-channel FET (PFET) will be formed. For illustrative purposes only, the NFETs and PFETs being formed are shown side by side one another. While the present techniques can be employed to form NFETs and PFETs side-by-side on a wafer that is not a requirement, and embodiments are contemplated herein where the NFETs and PFETs are formed on different regions of a wafer.

Figure 1:
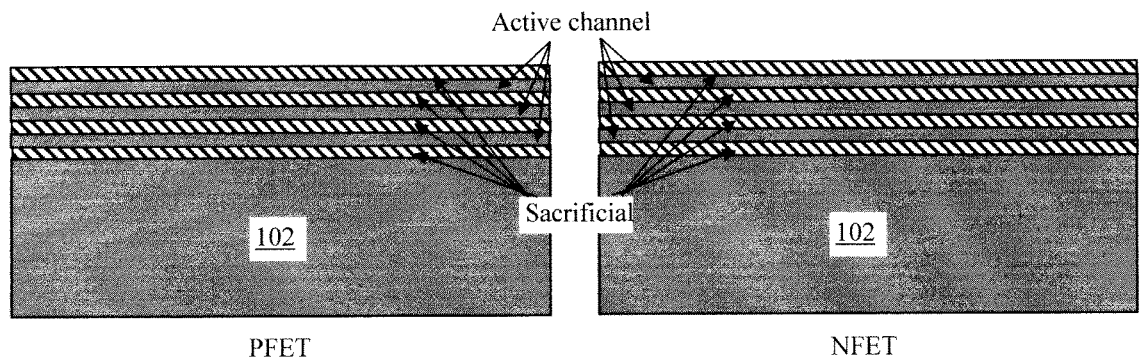
FIG. 1 is a cross-sectional diagram illustrating alternating active channel and sacrificial nanosheets having been formed in a stack on a substrate according to an embodiment of the present invention.

The process for forming the (NFET and PFET) nanosheet devices begins by forming alternating active channel and sacrificial nanosheets in a stack on a substrate 102. See FIG. 1. Specifically, as shown in FIG. 1, a sacrificial nanosheet is formed on the substrate 102, followed by an active channel nanosheet, then another sacrificial nanosheet, and so on. According to an exemplary embodiment, the active channel and sacrificial nanosheets are epitaxially grown on the substrate 102. By 'sacrificial' it is meant that at least a portion of the sacrificial nanosheets are removed from the stack later on in the process. Specifically, as will be described in detail below, the sacrificial nanosheets are removed from the stack selective to the active channel nanosheets. That way, the active channel nanosheets can be released from the stack, permitting the gate of the device to fully surround a portion of each of the active channel nanosheets in a gate-all-around (GAA) configuration.

To enable selective removal of the sacrificial nanosheets, the sacrificial and active channel nanosheets need to be formed from materials with etch selectivity. By way of example only, silicon (Si) and silicon germanium (SiGe) are suitable active channel and/or sacrificial materials. For instance, when SiGe is used as the sacrificial material (and Si the active channel material), a SiGe-selective etch can be used to remove the (SiGe) sacrificial nanosheets selective to the (Si) active channel nanosheets. Conversely, when Si is used as the sacrificial material (and SiGe the active channel material), a Si-selective etch can be used to remove the (Si) sacrificial nanosheets selective to the (SiGe) active channel nanosheets. Thus, in the present example, Si or SiGe can be used as the channel material or the sacrificial material for the other.

Suitable substrates include, but are not limited to, bulk semiconductor wafers (e.g., a bulk silicon (Si) wafer, a bulk germanium (Ge) wafer, a bulk silicon germanium (SiGe) wafer, a bulk III-V wafer, etc.) and semiconductor-on-insulator (SOI) wafers. An SOI wafer naturally provides isolation between source and drain. SOI wafers include a SOI separated from an underlying substrate by a buried insulator. When the buried insulator is an oxide, it is also referred to as a buried oxide or BOX. Suitable materials for the SOI layer include, but are not limited to, Si, Ge, SiGe, III-V, etc. Substrate 102 shown in FIG. 1 generically represents any of these substrate configurations.

Figure 2:
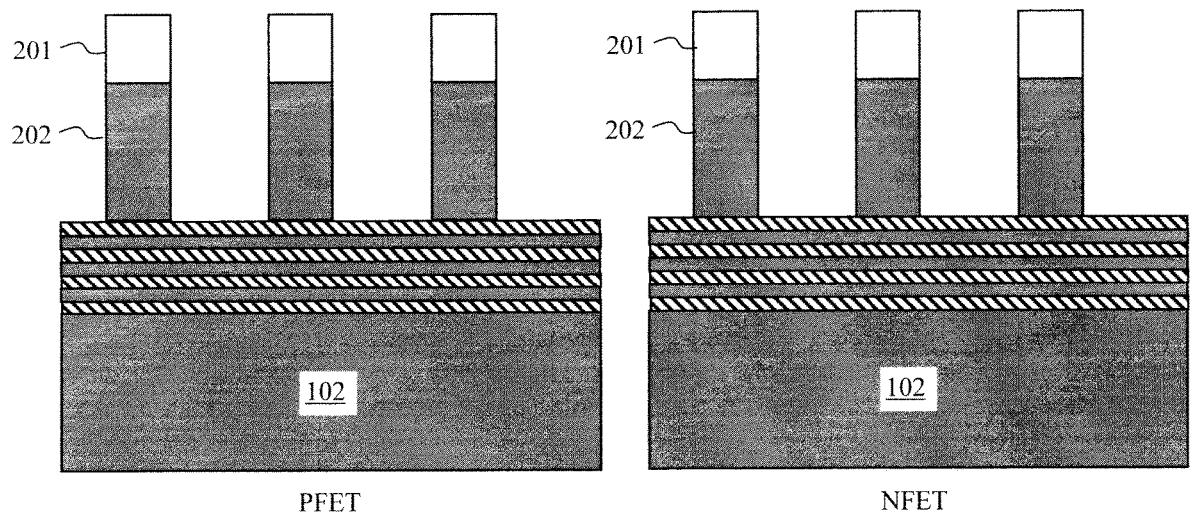
FIG. 2 is a cross-sectional diagram illustrating dummy gates having been formed on the stack according to an embodiment of the present invention.

Next, as shown in FIG. 2, dummy gates 202 are formed on the stack. Namely, according to an exemplary embodiment, a gate-last approach is employed whereby the dummy gates 202 are first formed over what will be the channel regions of the NFETs and PFETs. The dummy gates 202 serve as a placeholder for replacement gates which will be formed later in the process. Specifically, the dummy gates 202 permit placement of the source and drains, dopant activation, etc., after which the dummy gates are removed and replaced by the replacement gates. A gate-last approach is helpful in protecting the gate from exposure to potentially harmful conditions (e.g., high temperatures) during processing, since the replacement gate is placed at the end of the process after the high-temperature anneals have already been performed. High-κ metal gates are particularly susceptible to processing damage.

The dummy gates 202 are formed by blanket depositing a suitable dummy gate material onto the stack, forming dummy gate hardmasks 201 on the dummy gate material (the dummy gate hardmasks 201 marking the footprint and location of the dummy gates 202), and then using the dummy gate hardmasks 201 to pattern the individual dummy gates 202 shown in FIG. 2. Suitable dummy gate materials include, but are not limited to, poly-silicon (poly-Si). Suitable gate hardmask materials include, but are not limited to, nitride hardmask materials such as silicon nitride (SiN).

Figure 3:
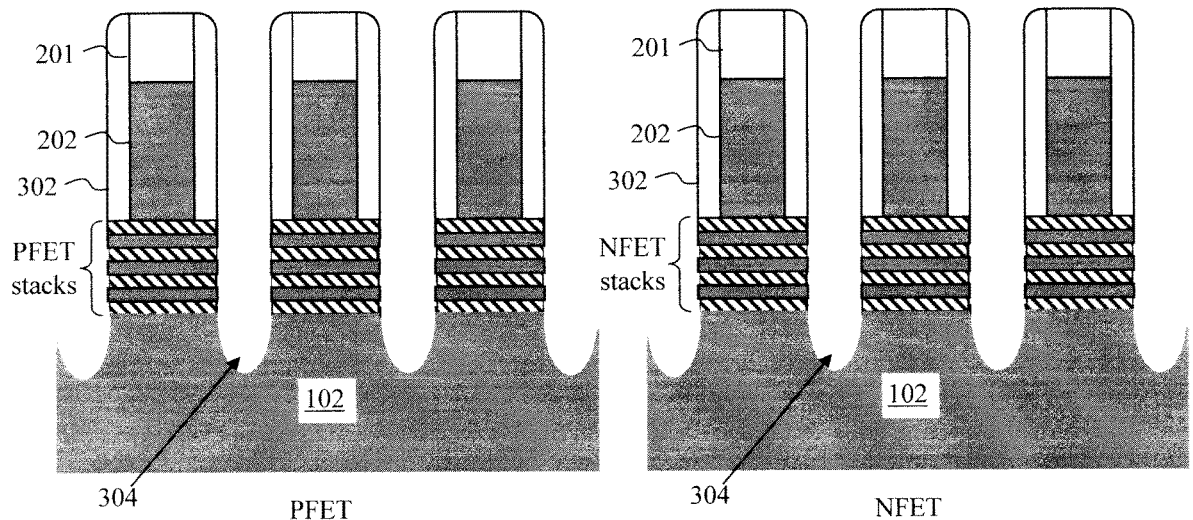
FIG. 3 is a cross-sectional diagram illustrating spacers having been formed alongside opposite sidewalls of the dummy gates and an etch (between the spacers) having been used to pattern the stack into individual NFET and PFET stacks forming pocket in the substrate between the stacks according to an embodiment of the present invention.
Figure 4:
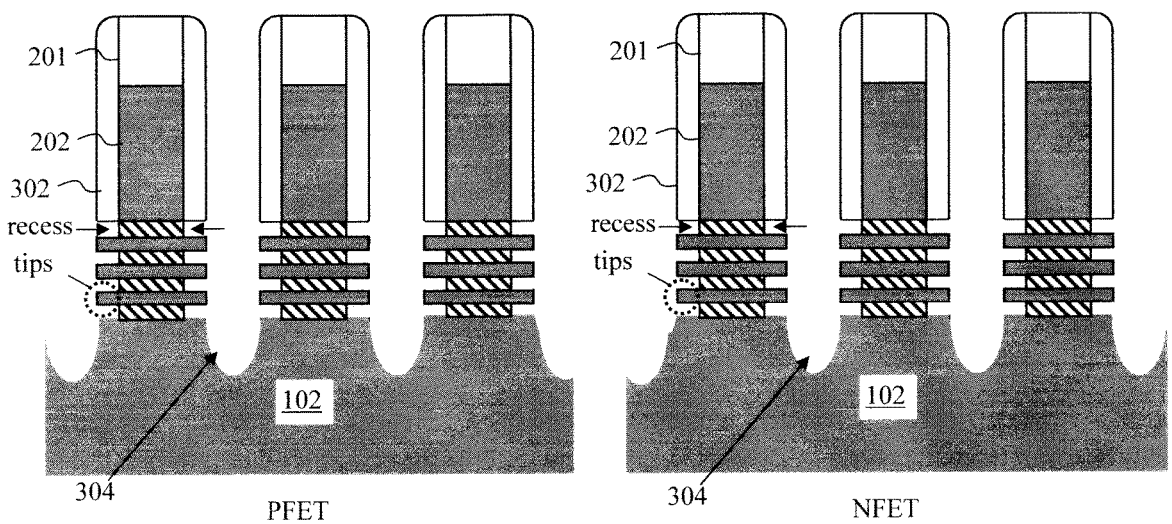
FIG. 4 is a cross-sectional diagram illustrating a lateral recess etch of the sacrificial nanosheets in each of the (PFET and NFET) stacks having been performed exposing tips of the active channel nanosheets according to an embodiment of the present invention.

With the dummy gates 202 in place, the stack is then patterned into the individual PFETs and NFETs. See FIG. 3. Namely, as shown in FIG. 3 spacers 302 are formed alongside opposite sidewalls of the dummy gates 202. The spacers 302 serve to offset the dummy gates 202 from the source and drain regions (to be formed below). Suitable spacer materials include, but are not limited to, silicon borocarbon nitride (SiBCN), silicon oxycarbon nitride (SiOCN) and/or silicon oxycarbide (SiOC).

An etch (between the spacers 302) is then used to pattern the stack into individual NFET and PFET stacks. According to an exemplary embodiment, the stack etch is performed using a directional etching process such as reactive ion etching (RIE). This patterning of the stack will expose the underlying substrate 102. In fact, as shown in FIG. 3, depending on the selectivity of the etching process, pockets 304 can be formed in the substrate in between the stacks. During subsequent source and drain formation, epitaxial growth on the underlying substrate 102 can undesirably lead to source-to-drain shorts between adjacent source and drain regions. Thus, without provisions in place to prevent epitaxial growth at the substrate 102, inoperable devices can be formed. Advantageously, pockets 304 provide space between the stacks where a protection layer (e.g., a protective oxide layer) can be grown to prevent source and drain epitaxial growth at the substrate 102.

A lateral recess etch of the sacrificial nanosheets in each of the (PFET and NFET) stacks is then performed. See FIG. 4. This lateral etch exposes the ends of the active channel nanosheets to enable formation of the source and drains in contact therewith. Specifically, as will be described in detail below, an epitaxial process will be used to grow the source and drains at opposite ends of the active channel nanosheets. By recessing the sacrificial nanosheets (and forming inner spacers—see below), it is insured that growth of the source and drain epitaxy will be from the tips of the active channel nanosheets, rather than from the sacrificial nanosheets. The lateral recess etch can be performed using a non-directional (isotropic) etching process such as a wet or dry etching process.

Inner spacers 502 are then formed covering the tips of the active channel nanosheets. See FIG. 5. These inner spacers 502 will be used to selectively mask the tips of the active channel nanosheets in one of the (PFET or NFET) stacks while the source and drain epitaxy is grown in the other, and vice versa. Suitable materials for the inner spacers include, but are not limited to, SiBCN, SiOCN and/or SiOC. The inner spacers 502 can be formed by blanket depositing the spacer material onto the stacks (and surrounding the tips of the active channel nanosheets), and then using a non-directional etch (isotropic) to etch back close to the tips of channels 502. Following the non-directional etching process, a directional (anisotropic) spacer RIE process can be used to remove any of the spacer material that might be remaining in the pockets 304.

Figure 5:
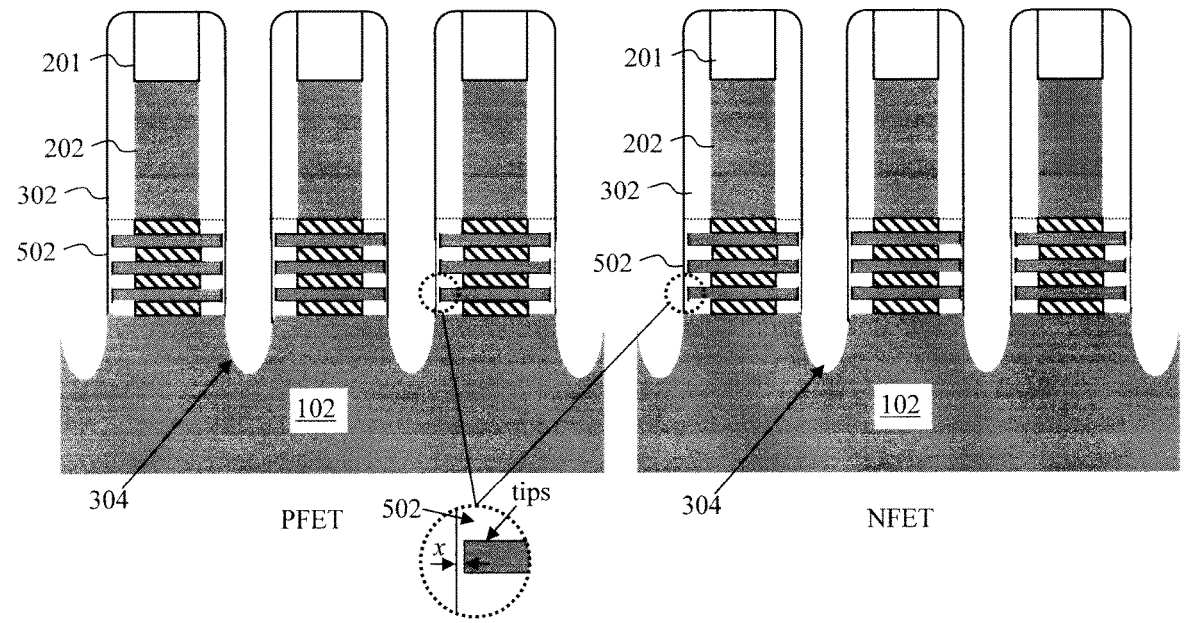
FIG. 5 is a cross-sectional diagram illustrating inner spacers having been formed covering the tips of the active channel nanosheets according to an embodiment of the present invention.

As shown in FIG. 5, the inner spacers cover the tips of the active channel nanosheets. According to an exemplary embodiment, the inner spacer RIE is configured to x amount of the inner spacers 502 covering the tips of the active channel nanosheets, wherein x is about 2-6 nm. See FIG. 5. As provided above, these inner spacers will protect the tips of the active channel nanosheets in one device stack (PFET or NFET) while the source and drains are formed in the other, and vice versa.

Figure 6:
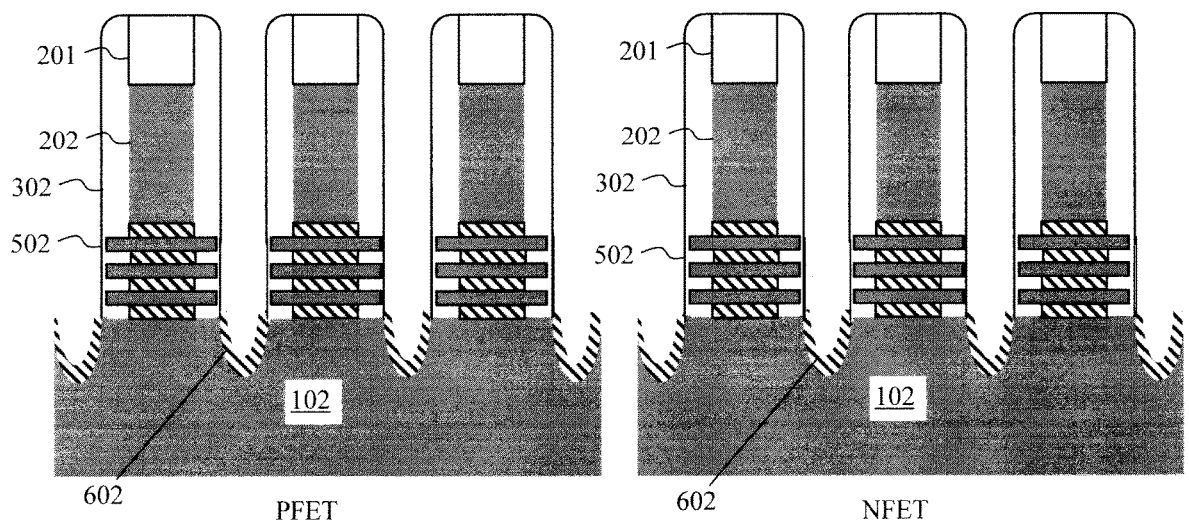
FIG. 6 is a cross-sectional diagram illustrating a SiGe layer having been grown in the pockets according to an embodiment of the present invention.

Provisions are then made to prevent source and drain epitaxial growth from occurring at the substrate beneath the source and drains. Specifically, as shown in FIG. 6 a SiGe layer 602 is grown in the pockets 304. According to an exemplary embodiment, the SiGe layer 602 has a percentage of Ge of from about 22% to about 25%, and ranges therebetween. The concept being leveraged here to form a protective layer below the source and drains is illustrated in FIG. 7.

Figure 7:
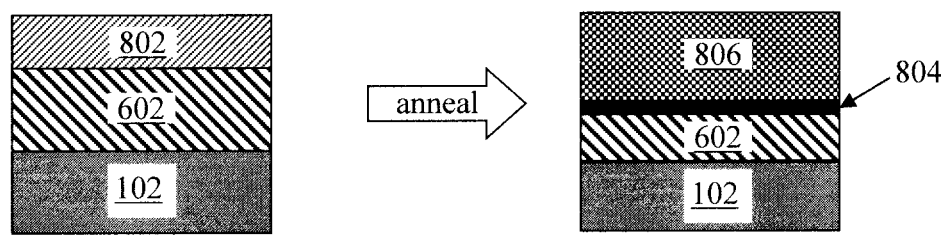
FIG. 7 is a diagram illustrating a Ge condensation reaction that is employed to form an oxide protective layer covering the substrate in between the stacks according to an embodiment of the present invention.
Figure 7:
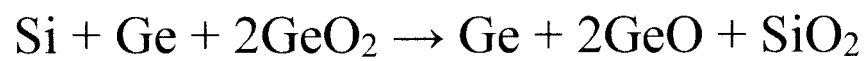
Figure 8:
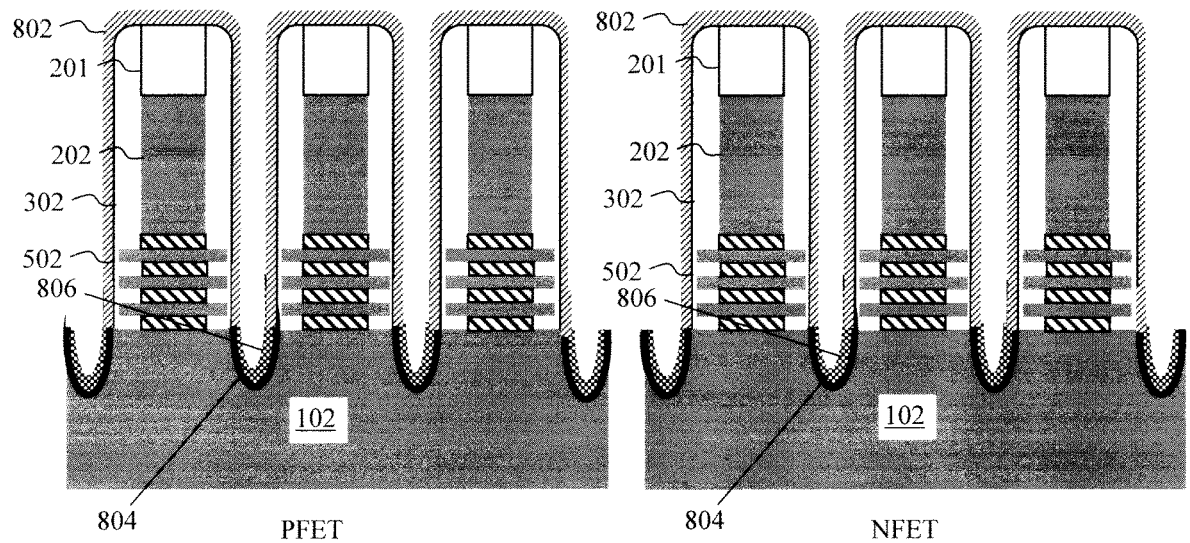
FIG. 8 is a cross-sectional diagram illustrating a condensation reaction having been performed (using a $GeO_2$ layer deposited over the spacers and inner spacers, and onto the SiGe layer in the pockets) to form a condensed SiGe layer on the SiGe layer, and the oxide protective layer on the condensed SiGe layer according to an embodiment of the present invention.
Figure 9:
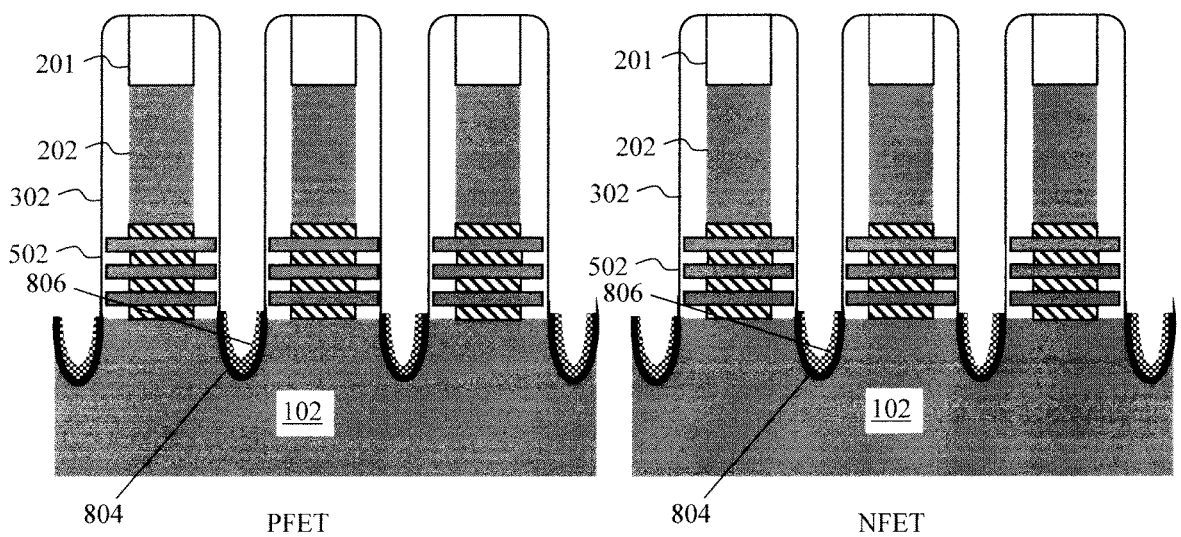
FIG. 9 is a cross-sectional diagram illustrating unreacted $GeO_2$ having been removed according to an embodiment of the present invention.

As shown in FIG. 7, a Ge condensation reaction is employed to ultimately form an oxide (silicon dioxide ($SiO_2$)) protective layer 806 (see FIG. 8—described below) covering the substrate 102 that will prevent the formation of source and drain epitaxy in the pockets 304. The components of the reaction include the SiGe layer 602 grown on the substrate 102, and a germanium oxide ($GeO_2$) layer 802 (see FIG. 8—described below) deposited onto the SiGe layer 602. An anneal is then performed under conditions sufficient to condense the Ge (forming a condensed SiGe layer 804—i.e., having a higher percentage of Ge) on the SiGe layer 602 and, as a by-product of the reaction, the oxide (e.g., $SiO_2$) protective layer 806 on the condensed SiGe layer 804. See FIG. 7. As shown in FIG. 7, germanium monoxide (GeO)—a volatile component—is also a by-product of the condensation reaction. According to an exemplary embodiment, the conditions include a temperature of from about 400° C. to about 600° C., and ranges therebetween in a nitrogen ($N_2$) ambient.

The amount of the SiGe layer 602 in the pockets 304 (see FIG. 6) depends on how much $SiO_2$ conversion is needed with the $GeO_2$ layer 802. According to an exemplary embodiment, SiGe layer 602 is grown to a thickness of from about 15 nm to about 20 nm, and ranges therebetween.

The $GeO_2$ layer 802 is then deposited over the spacers 302 and inner spacers 502, and onto the SiGe layer 602 in the pockets 304. The above-described condensation reaction is then performed to form the condensed SiGe layer 804 on the SiGe layer 602, and the oxide (e.g., $SiO_2$) protective layer 806 on the condensed SiGe layer 804. It is notable that the condensation reaction is limited to locations where the $GeO_2$ layer 802 is in direct contact with the SiGe layer 602, i.e., in the pockets 304. The inner spacers 502 protect the tips of the active channel nanosheets during this process.

As described above, as a result of the condensation reaction, the condensed SiGe layer 804 will have a higher percentage of Ge than SiGe layer 602. By way of example only, following the reaction, the condensed SiGe layer 804 will have a Ge percentage of from about 35% to about 55%, and ranges therebetween.

Unreacted $GeO_2$, i.e., those portions of the $GeO_2$ layer 802 present on the spacers 302 and inner spacers 502 is then removed. See FIG. 9. The unreacted $GeO_2$ can be removed using deionized water. According to an exemplary embodiment, the oxide protective layer 806 formed in the pockets 304 has a thickness of from about 3 nm to about 10 nm, and ranges therebetween.

Block masks are then used to selectively mask the PFET or NFET stacks in-turn while the tips of the active channel nanosheets are exposed in the other for source and drain formation. Arbitrarily, in the present example PFET source and drains will be formed, followed by the NFET source and drains. It is notable, however, that the PFET and NFET source and drains can be formed in any order.

Figure 10:
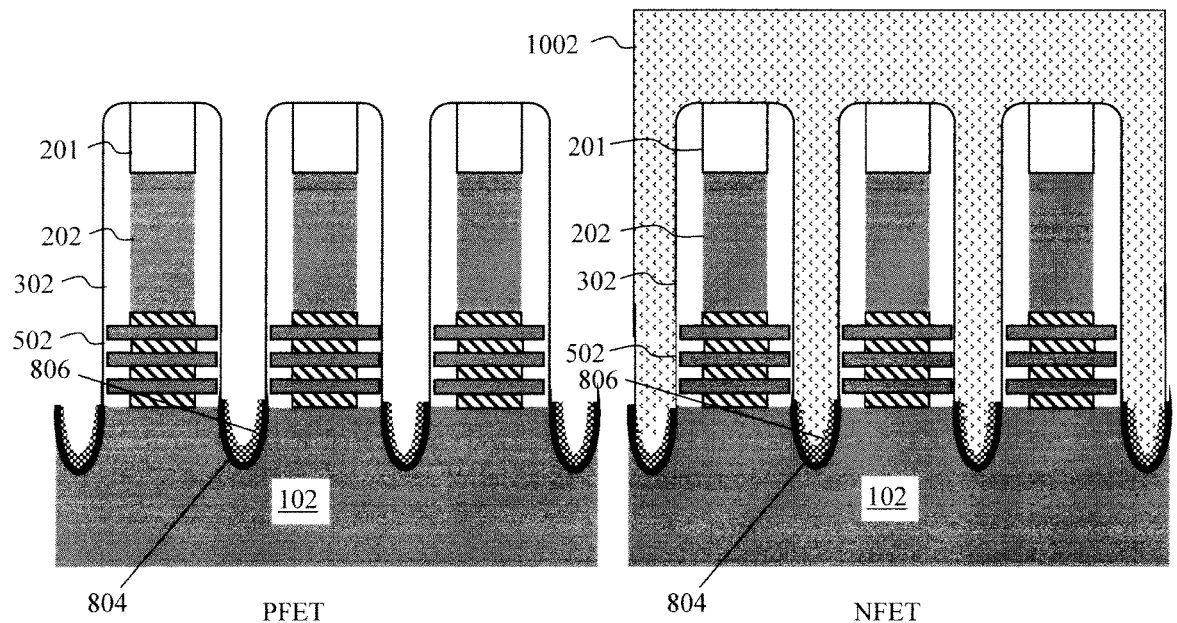
FIG. 10 is a cross-sectional diagram illustrating a block mask having been formed covering the NFET stacks according to an embodiment of the present invention.

Specifically, as shown in FIG. 10, a block mask 1002 is formed covering the NFET stacks. Suitable block mask materials include, but are not limited to, organic planarizing (OPL) materials. Standard lithography and etching techniques can be used to pattern the block mask 1002 selectively over the NFET stacks.

Figure 11:
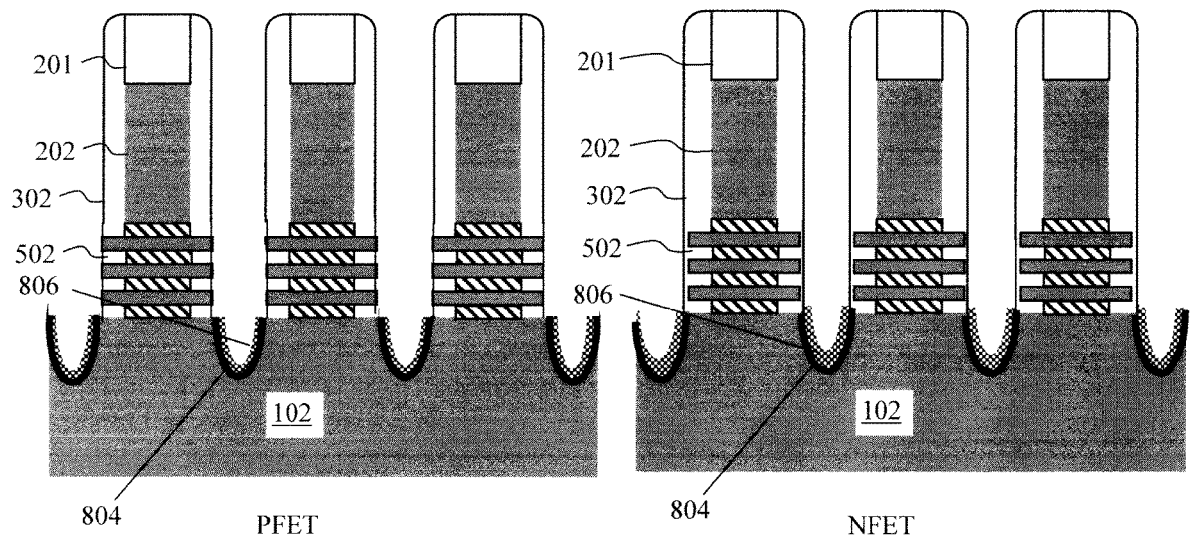
FIG. 11 is a cross-sectional diagram illustrating the block mask having been removed following etch back of the inner spacers in the PFET stacks to expose tips of the active channel nanosheets in the PFET stacks according to an embodiment of the present invention.

With the block mask 1002 in place, the inner spacers 502 along the (exposed) PFET stacks are then etched back to expose the tips of the active channel nanosheets in the PFET stacks. This will enable formation of the PFET source and drains in contact with the tips of the active channel nanosheets in the PFET stacks. Following etch back of the inner spacers 502, the block mask 1002 is removed. See FIG. 11. As shown in FIG. 11, based on the placement of the block mask over the NFET stacks during the etch back, the tips of the active channel nanosheets in the PFET stacks are now exposed, while the tips of the active channel nanosheets in the NFET stacks remain covered by (e.g., an amount x of from about 2 nm to about 5 nm, and ranges therebetween) the inner spacers 502.

Figure 12:
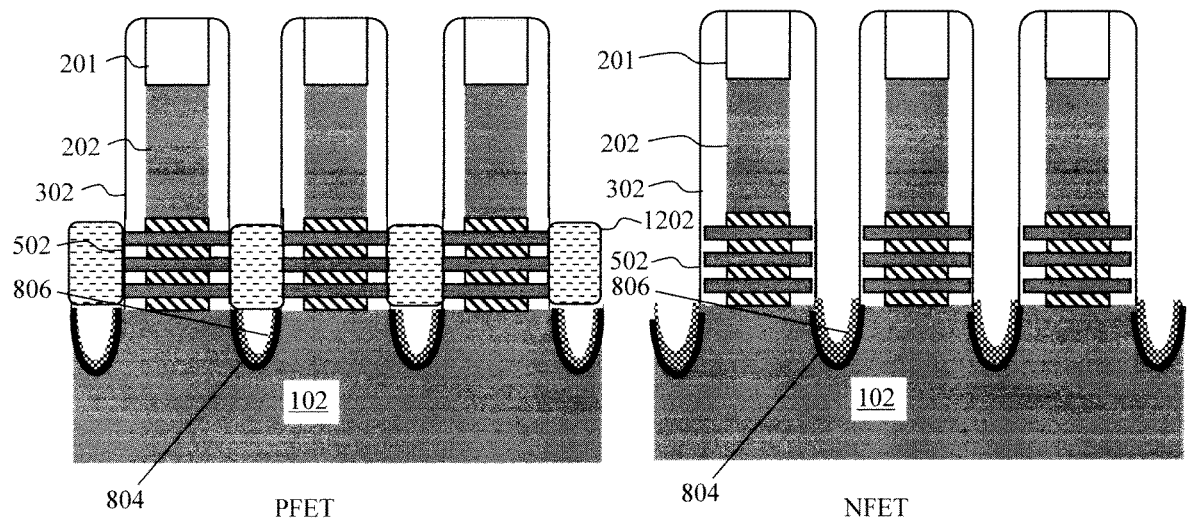
FIG. 12 is a cross-sectional diagram illustrating PFET source and drains having been formed using epitaxial growth from the exposed tips of the active channel nanosheets in the PFET stacks according to an embodiment of the present invention.
Figure 13:
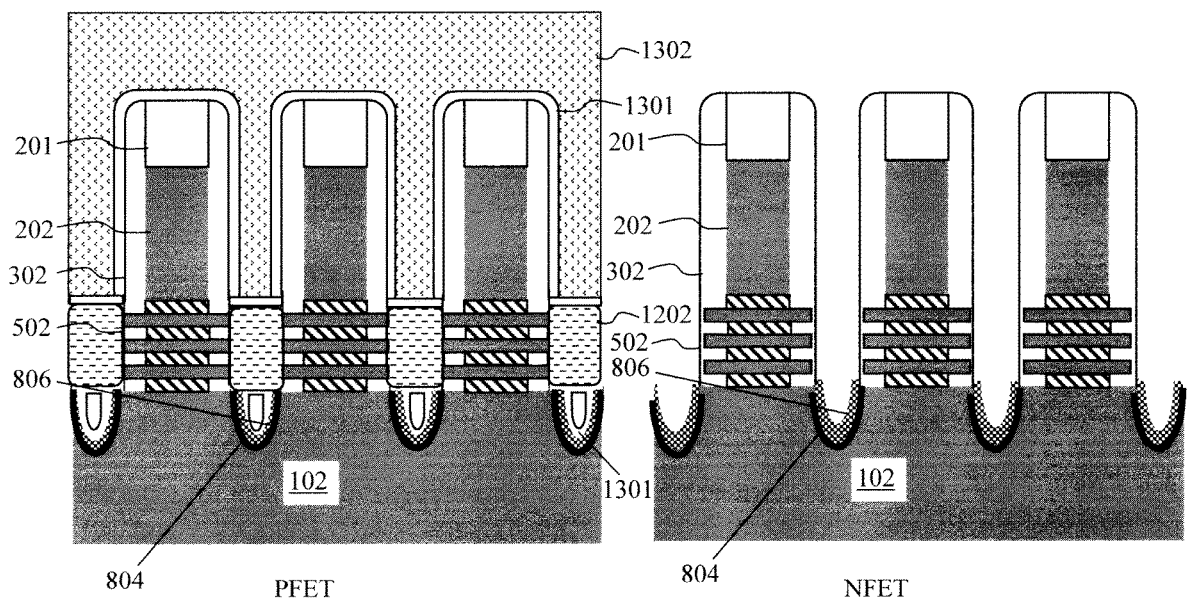
FIG. 13 is a cross-sectional diagram illustrating a second block mask having been formed over the PFET stacks protected with a dielectric cap according to an embodiment of the present invention.

As shown in FIG. 12, PFET source and drains 1202 are then formed using epitaxial growth (Si, Ge, SiGe, etc.) from the exposed tips of the active channel nanosheets in the PFET stacks. The epitaxial PFET source and drains are doped in-situ (e.g., during growth) or ex-situ (e.g., via ion implantation) with a p-type dopant. Suitable p-type dopants include, but are not limited to, boron (B). Due to the presence of the oxide protective layer 806 covering the substrate 102 in between the stacks, epitaxial growth on the substrate beneath the source and drains 1202 is prevented. Prior to the epitaxial growth, a preclean is used to clean the Si or SiGe surfaces. By way of example only, dry or wet etch processes are operated with hydrofluoric acid (HF)-containing etchants. This preclean of epitaxial growth etches some amount of the oxide protective layer 806 and inner spacers 502 of the NFET. However, the thickness of the oxide protective layer 806 and inner spacers 502 is thick enough so that from about 1 nm to about 5 nm, and ranges therebetween, of dielectric (i.e., oxide protective layer 806 and inner spacers 502) remains protecting the bottom of PFET source and drains 1202 and the tips of the NFET active channel nanosheets after the preclean process for epitaxial growth.

Figure 14:
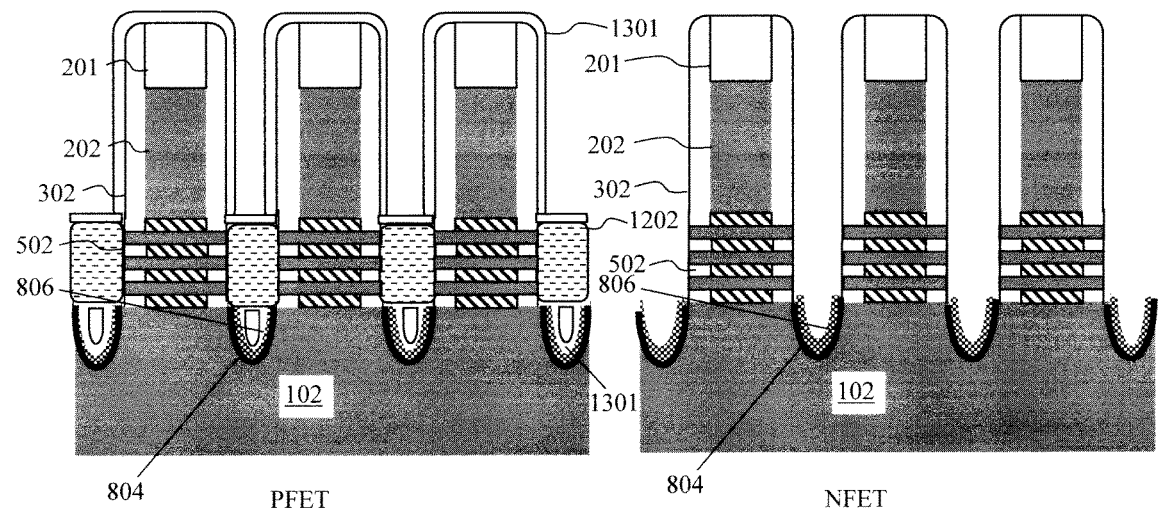
FIG. 14 is a cross-sectional diagram illustrating the etch back of the inner spacers in the NFET stacks to expose tips of the active channel nanosheets in the NFET stacks following block layer removal from PFET stacks protected with a dielectric cap according to an embodiment of the present invention.

The process is then repeated sequentially to form source and drains on the NFET side. First however, a thin capping layer 1301 is formed over/protecting the PFET stacks during the NFET epitaxy (preventing NFET epitaxial growth on the PFET source and drains 1202). See FIG. 13. According to an exemplary embodiment, the capping layer 1301 has a thickness of from about 2 nm to about 5 nm, and ranges therebetween. To form the capping layer 1301, a suitable dielectric material (such as SiN, SiOCN, SiBCN, and $SiO_2$ is deposited over both the PFET and NFET stacks. Standard lithography and etching techniques are then used to pattern a block mask 1302 selectively covering the PFET stacks (and the dielectric material covering the PFET stacks). With the block mask 1302 in place, the dielectric material covering the NFET stacks is removed (leaving behind the thin capping layer 1301 covering the PFET stacks beneath the block mask 1302) and the inner spacers 502 along the (exposed) NFET stacks are etched back to expose the tips of the active channel nanosheets in the NFET stacks. This will enable formation of the NFET source and drains in contact with the tips of the active channel nanosheets in the NFET stacks. Following the etch back of the inner spacers 502, the block mask 1302 is removed. See FIG. 14. As shown in FIG. 14, based on the placement of the block mask over the PFET stacks during the etch back, the tips of the active channel nanosheets in the NFET stacks are now exposed.

Figure 15:
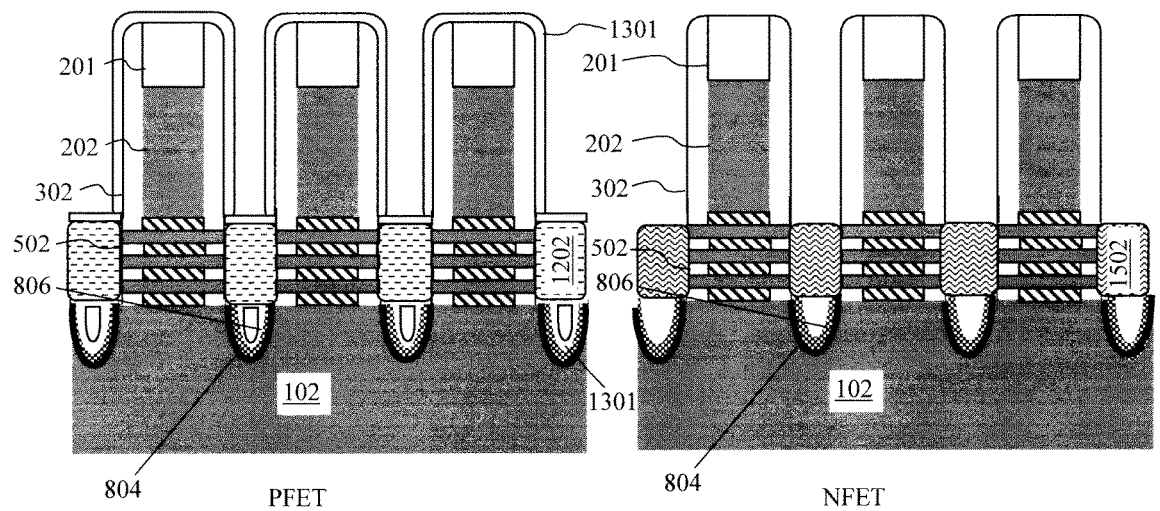
FIG. 15 is a cross-sectional diagram illustrating NFET source and drains having been formed using epitaxial growth from the exposed tips of the active channel nanosheets in the NFET stacks according to an embodiment of the present invention.

As shown in FIG. 15, NFET source and drains 1502 are then formed using epitaxial Si:C growth from the exposed tips of the active channel nanosheets in the NFET stacks. The epitaxial NFET source and drains are doped in-situ (e.g., during growth) or ex-situ (e.g., via ion implantation) with an n-type dopant. Suitable n-type dopants include, but are not limited to, phosphorous (P) and arsenic (As). Due to the presence of the oxide protective layer 806 covering the substrate 102 in between the stacks, epitaxial growth on the substrate beneath the source and drains 1502 is prevented. Following formation of the NFET source and drains 1502, the thin capping layer 1301 can be removed (as shown in the figures) or, optionally, can be left in place covering the PFET stacks.

Figure 16:
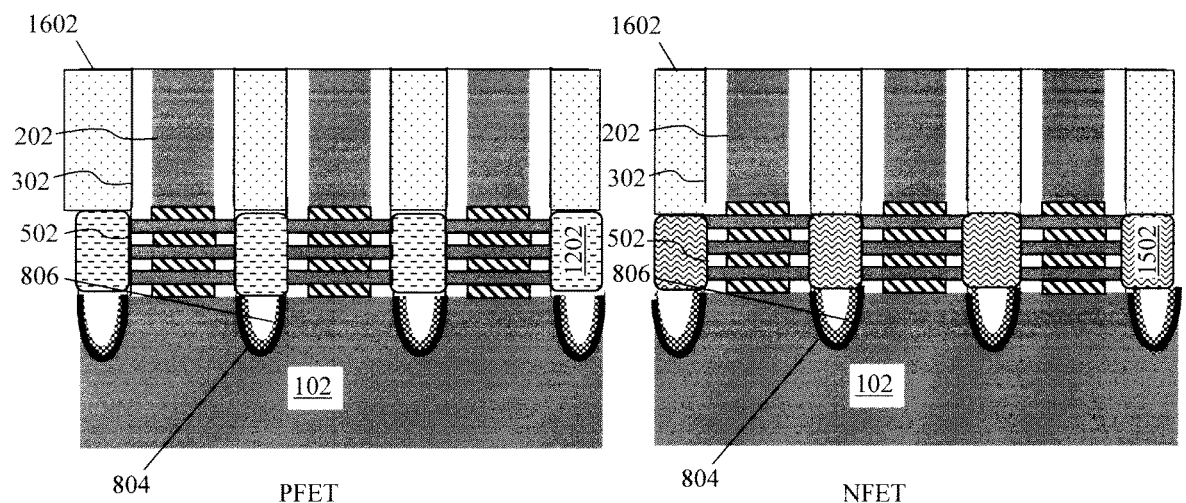
FIG. 16 is a cross-sectional diagram illustrating the dummy gates having been buried in a dielectric material according to an embodiment of the present invention.
Figure 17:
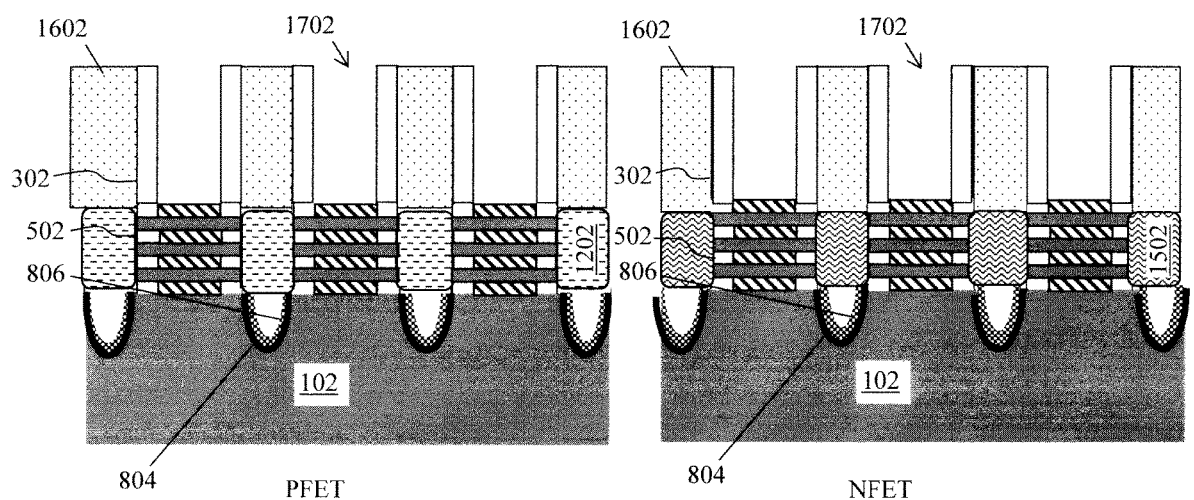
FIG. 17 is a cross-sectional diagram illustrating the dummy gates having been selectively removed forming gate trenches in the dielectric material according to an embodiment of the present invention.

With formation of the source and drains 1202 and 1502 completed, the dummy gates 202 are next removed and replaced with the final (i.e., replacement) gates of the device. First, the dummy gates 202 are buried in a dielectric material 1602, such as an interlayer dielectric (ILD). See FIG. 16. As shown in FIG. 16, the dielectric material 1602 is then polished down to the tops of the dummy gates 202, e.g., using a process such as chemical-mechanical polishing (CMP). This polishing step exposes the tops of the dummy gates 202. An etch, such as a Si selective RIE or wet etching process is then used to selectively remove the dummy gates, forming gate trenches 1702 in the dielectric material 1602. See FIG. 17.

Figure 18:
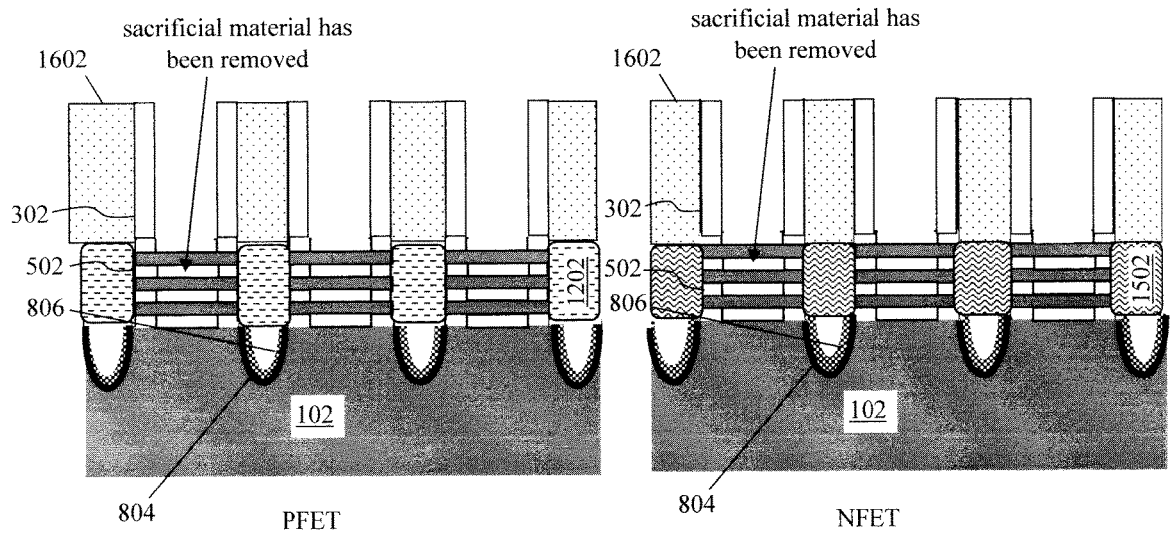
FIG. 18 is a cross-sectional diagram illustrating the sacrificial nanosheets having been selectively removed from the PFET and NFET stacks in the gate trenches according to an embodiment of the present invention.

Removal of the dummy gates 202 provides access to the stacks in the channel regions of the PFET and NFET stacks. As shown in FIG. 18, the sacrificial nanosheets are then selectively removed from the PFET and NFET stacks in the gate trenches 1702. Removal of the sacrificial nanosheets will enable access fully around a portion of each of the active channel nanosheets in the PFET and NFET stacks, enabling a GAA configuration for the replacement gate (see below). As provided above, a combination of Si and SiGe may be employed for the active channel and sacrificial materials. Accordingly, when SiGe is the sacrificial material, it can be removed using a SiGe-selective etch chemistry. Conversely, when Si is the sacrificial material, it can be removed using a Si-selective etch chemistry. This removal of the sacrificial material from the PFET and NFET stacks fully releases the active channel nanosheets from the stacks, i.e., the active channel nanosheets are suspended in the channel regions of the PFET and NFET stacks.

Figure 19:
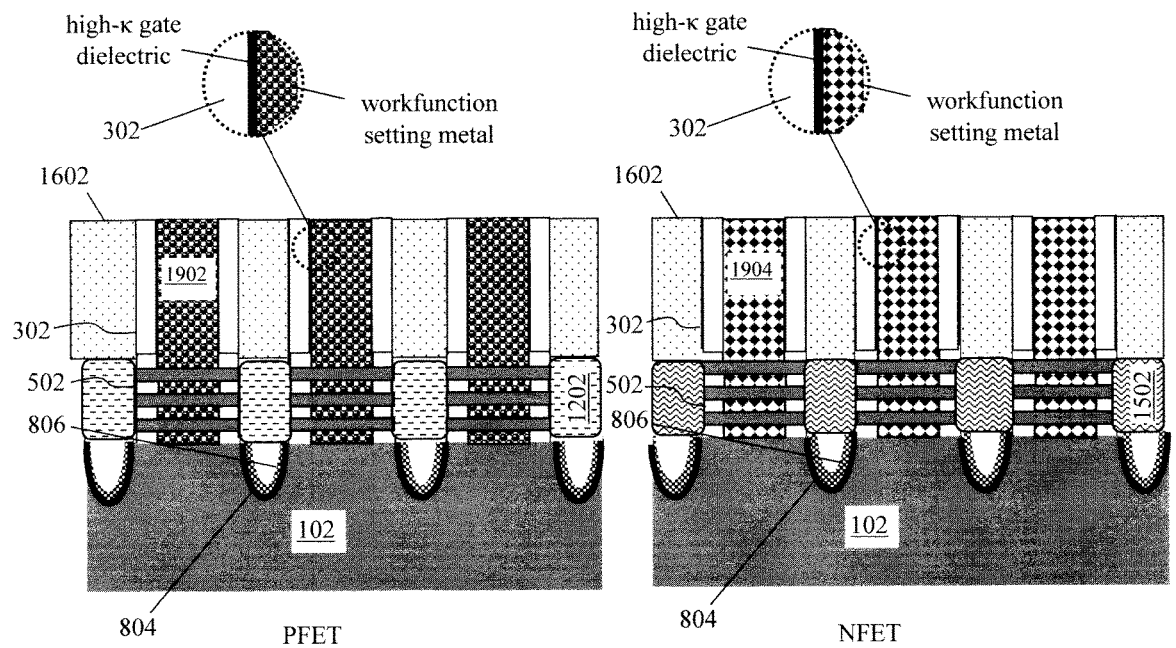
FIG. 19 is a cross-sectional diagram illustrating replacement gates having been formed in the gate trenches over the PFET and NFET stacks that surround a portion of each of the active channel nanosheets in a gate-all-around configuration according to an embodiment of the present invention.

Finally, as shown in FIG. 19, replacement gates 1902 and 1904 have been formed in the gate trenches 1702 over the PFET and NFET stacks respectively. As shown in FIG. 19, based on the active channel nanosheets having been fully released from the stack, the replacement gates 1902 and 1904 fully surround a portion of each of the active channel nanosheets in a GAA configuration. As also shown in FIG. 19, the replacement gates 1902 and 1904 can be configured differently for the PFET and NFET devices. For instance, according to an exemplary embodiment, the replacement gates 1902 and 1904 include a high-κ metal gate stack having a high-κ gate dielectric and a workfunction setting metal gate over the high-κ gate dielectric.

The particular workfunction setting metal employed can vary depending on whether an NFET (n-type workfunction setting metal) or PFET (p-type workfunction setting metal) is being formed. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nanometers (nm)) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-κ gate dielectrics include, but are not limited to, $HfO_2$ and/or lanthanum oxide ($La_2O_3$).

As shown in FIG. 19, the NFET and PFET devices each now include epitaxial source and drains 1202 and 1502 on opposite sides of the PFET and NFET stacks, and replacement gates 1902 and 1904 surrounding at least a portion of each of the active channel nanosheets in a gate-all-around (GAA) configuration. The inner spacers 502 offset the replacement gates 1902 and 1904 from the epitaxial source and drains 1202 and 1502.

In the above example, two block masks were used to form the source and drains, e.g., one block mask to cover the NFET while the tips of the active channel nanosheets of the PFET were exposed, and another block mask to cover the PFET while the tips of the active channel nanosheets of the NFET were exposed. Embodiments are also contemplated herein where a single block mask is used, as described above, to form the source and drains in one type of device (e.g., the PFET devices in the example above). By contrast, however, the above-described Ge condensation process is also then used to form a (second) oxide protective layer covering/protecting the source and drains that have been formed. With this second oxide protective layer in place, the other device (NFET in this example) can be processed to form the NFET source and drains without the need for a second block mask.

Figure 20:
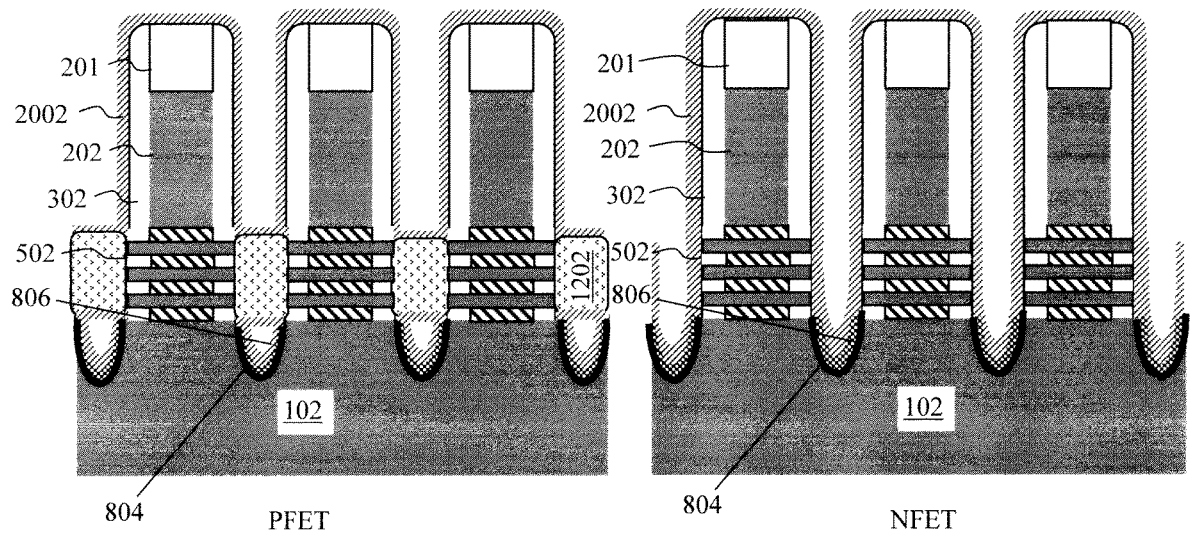
FIG. 20 is a cross-sectional diagram illustrating, according to an alternative embodiment that follows from FIG. 12, a (second) $GeO_2$ layer having been blanket deposited over both PFET and NFET stacks and, in particular, on the source and drains of the PFET stacks according to an embodiment of the present invention.
Figure 21:
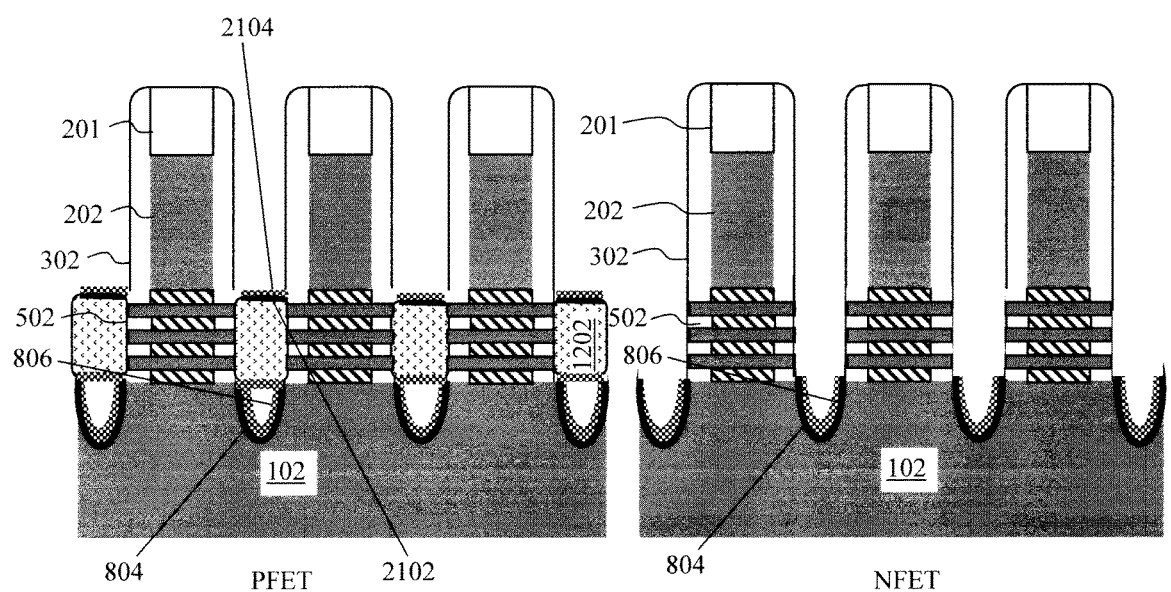
FIG. 21 is a cross-sectional diagram illustrating a condensation reaction having been performed to form a (second) condensed SiGe layer on the source and drains of the PFET stacks and a (second) oxide protective layer on the second condensed SiGe layer according to an embodiment of the present invention.

This alternative embodiment begins in the same manner as described in conjunction with the description of FIGS. 1-12 above. As such, like structures are numbered alike in the following description and figures. Following from FIG. 12, as shown in FIG. 20 a (second) $GeO_2$ layer 2002 is blanket deposited over both PFET and NFET stacks and, in particular, on the source and drains 1202 of the PFET stacks. In this particular example, the source and drains 1202 include SiGe in order to enable the above-described Ge condensation reaction to be performed. Namely, the above-described Ge condensation reaction (the conditions of which were provided above) is then performed to form a (second) condensed SiGe layer 2102—i.e., having a higher percentage of Ge on the (SiGe) source and drains 1202 and, as a by-product of the reaction, the (second) oxide (e.g., $SiO_2$) protective layer 2104 on the condensed SiGe layer 2102. Following the condensation reaction, unreacted $GeO_2$ layer 2002 is removed in the same manner as described above. See FIG. 21.

Figure 22:
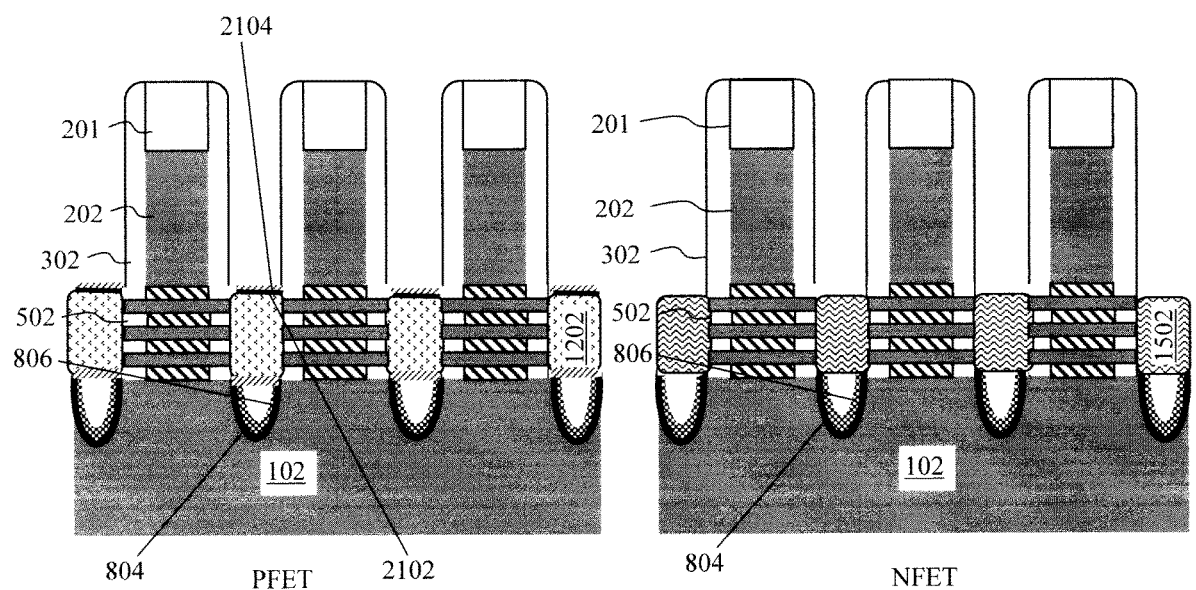
FIG. 22 is a cross-sectional diagram illustrating the inner spacers along the (exposed) NFET stacks are then etched back to expose the tips of the active channel nanosheets in the NFET stacks, and NFET source and drains having been formed using epitaxial growth from the exposed tips of the active channel nanosheets in the NFET stacks according to an embodiment of the present invention.

The remainder of the process is then performed in the same manner as described above, except that the (second) oxide (e.g., $SiO_2$) protective layer 1304 is now present over/protecting the (PFET) source and drains 1202, thus foregoing the need for a second block mask (i.e., the block mask 1302 in the example above is not needed). Namely, as shown in FIG. 22, the inner spacers 502 along the (exposed) NFET stacks are then etched back to expose the tips of the active channel nanosheets in the NFET stacks. This will enable formation of the NFET source and drains epitaxial growth in contact with the tips of the active channel nanosheets in the NFET stacks.

NFET source and drains 1502 are then formed using epitaxial Si:C growth from the exposed tips of the active channel nanosheets in the NFET stacks. The epitaxial NFET source and drains are doped in-situ (e.g., during growth) or ex-situ (e.g., via ion implantation) with an n-type dopant. As provided above, suitable n-type dopants include, but are not limited to, phosphorous (P) and arsenic (As). Due to the presence of the oxide protective layer 806 covering the substrate 102 in between the stacks, epitaxial growth on the substrate beneath the source and drains 1502 is prevented. The process can then proceed in the same manner as described above to remove the dummy gates 202, suspend the active channel nanosheets in the channel regions of the PFET and NFET stacks, and to form the replacement gates 1902 and 1904 surrounding a portion of each of the active channel nanosheets in a gate-all-around (GAA) configuration (as shown in FIGS. 16-19, described above).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A nanosheet device, comprising:
   individual PFET and NFET stacks on a substrate, wherein the PFET and NFET stacks each comprises active channel nanosheets;
   pockets in the substrate between the PFET and NFET stacks;
   a silicon germanium (SiGe) layer grown in the pockets;
   a condensed SiGe layer disposed on the SiGe layer;
   an oxide protective layer, disposed on the condensed SiGe layer, lining the pockets in the substrate;
   epitaxial source and drains on opposite sides of the PFET and NFET stacks;
   gates surrounding at least a portion of each of the active channel nanosheets; and
   inner spacers offsetting the gates from the epitaxial source and drains.

2. The nanosheet device of claim 1, wherein the gates surround the active channel nanosheets in a gate-all-around configuration.

3. The nanosheet device of claim 1, wherein the active channel nanosheets comprise silicon (Si).

4. The nanosheet device of claim 1, wherein the active channel nanosheets comprise silicon germanium (SiGe).

5. The nanosheet device of claim 1, further comprising:
   a second oxide protective layer over the epitaxial source and drains on the opposite sides of the PFET stacks.

6. The nanosheet device of claim 1, wherein the SiGe layer has a percentage of Ge of from about 22% to about 25%, and ranges therebetween.

7. The nanosheet device of claim 6, wherein the condensed SiGe layer has a percentage of germanium Ge of from about 35% to about 40%, and ranges therebetween.

8. The nanosheet device of claim 1, wherein the inner spacers comprise a material selected from the group consisting of: silicon borocarbon nitride (SiBCN), silicon oxycarbon nitride (SiOCN), silicon oxycarbide (SiOC), and combinations thereof.

9. The nanosheet device of claim 1, wherein the oxide protective layer has a thickness of from about 3 nm to about 10 nm, and ranges therebetween.

10. A nanosheet device, comprising:
    individual PFET and NFET stacks on a substrate, wherein the PFET and NFET stacks each comprises active channel nanosheets;
    pockets in the substrate between the PFET and NFET stacks;
    a SiGe layer grown in the pockets;
    a condensed SiGe layer disposed on the SiGe layer;
    an oxide protective layer, disposed on the condensed SiGe layer, lining the pockets in the substrate;
    epitaxial source and drains on opposite sides of the PFET and NFET stacks;
    a second oxide protective layer over the epitaxial source and drains on the opposite sides of the PFET stacks;
    gates surrounding at least a portion of each of the active channel nanosheets in a gate-all-around configuration; and
    inner spacers offsetting the gates from the epitaxial source and drains.

11. The nanosheet device of claim 10, wherein the active channel nanosheets comprise Si.

12. The nanosheet device of claim 10, wherein the active channel nanosheets comprise SiGe.

13. The nanosheet device of claim 10, wherein the inner spacers comprise a material selected from the group consisting of: SiBCN, SiOCN, SiOC, and combinations thereof.

14. A nanosheet device, comprising:
    individual PFET and NFET stacks on a substrate, wherein the PFET and NFET stacks each comprises active channel nanosheets;
    pockets in the substrate between the PFET and NFET stacks;
    a SiGe layer grown in the pockets;
    a condensed SiGe layer disposed on the SiGe layer;
    an oxide protective layer disposed on the condensed SiGe layer;
    epitaxial source and drains on opposite sides of the PFET and NFET stacks;
    gates surrounding at least a portion of each of the active channel nanosheets in a gate-all-around configuration; and
    inner spacers offsetting the gates from the epitaxial source and drains.

15. The nanosheet device of claim 14, wherein the active channel nanosheets comprise Si.

16. The nanosheet device of claim 14, wherein the active channel nanosheets comprise SiGe.

17. The nanosheet device of claim 14, wherein the SiGe layer has a percentage of Ge of from about 22% to about 25%, and ranges therebetween.

18. The nanosheet device of claim 14, wherein the condensed SiGe layer has a percentage of germanium Ge of from about 35% to about 40%, and ranges therebetween.

19. The nanosheet device of claim 14, wherein the inner spacers comprise a material selected from the group consisting of: SiBCN, SiOCN, SiOC, and combinations thereof.

* * * * *